United States Patent
Lin (10) Patent No.: US 6,239,733 B1
(45) Date of Patent: May 29, 2001

(54) CURRENT INTERPOLATION CIRCUIT FOR USE IN AN A/D CONVERTER

(75) Inventor: Chung-Ming Lin, Feng-Shan (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/322,503

(22) Filed: May 28, 1999

(51) Int. Cl.[7] ....................................................... H03M 1/36
(52) U.S. Cl. ............................................. 341/159; 341/155
(58) Field of Search ................................. 341/159, 161, 341/155, 135, 158; 327/334, 53, 361

(56) References Cited

U.S. PATENT DOCUMENTS 5,384,569 * 1/1995 Komatsu ............................... 341/159
5,594,444 * 1/1997 Yamada ............................... 341/159
5,598,161 * 1/1997 Yamada ............................... 341/159

* cited by examiner

Primary Examiner—Peguy Jeanpierre (57) ABSTRACT

A current interpolation circuit for use in an A/D converter is disclosed. The current interpolation circuit comprises current division circuits or current mirror circuits. Several reference voltages are converted into positive currents and negative currents by some folding amplifiers. Then the positive currents and the negative currents are fed to the current division circuits or the current mirror circuits, generating some positive currents and negative currents. Finally, a number of current comparators are configured to receive the generated positive currents and negative currents to produce differential voltage signals which are then used as interpolated levels.

12 Claims, 8 Drawing Sheets

CURRENT INTERPOLATION CIRCUIT FOR USE IN AN A/D CONVERTER

BACKGROUND OF THE INVENTION

1. Field of the Invention

The present invention relates to an electronic circuit for use in an analog-to-digital (A/D) converter, and more particularly, to a current interpolation circuit for interpolating requisite reference voltages.

2. Description of the Prior Art

A conventional flash type A/D converter is one of the fastest structure which directly utilizes $2^{n}-1$ (n is the number of bit resolution) comparators to compare the input analog voltage with $2^{n}-1$ reference voltages and then generate n bits output digital code. The disadvantage of this structure is its large number of comparators needed, thus increasing power consumption and chip area.

A conventional folding type A/D converter is used to reduce the number of comparators. In this configuration, because all $2^{n}-1$ reference voltages are folded into $2^{m}$ reference voltages (m<n) by a number of folding amplifiers, only $2^{m}$ comparators are needed in this structure. In order to reduce the number of folding amplifiers required, the interpolation technique is commonly used in the folding structure. Many interpolation circuits are used to interpolate the output voltage by means of a number of series-connected impedance elements. However, this technique is not suitable for high speed A/D converter due to its need of converting the output current from the transconductance stage to the desirable voltage, which will disadvantageously produce an extra pole.

Figure 2:
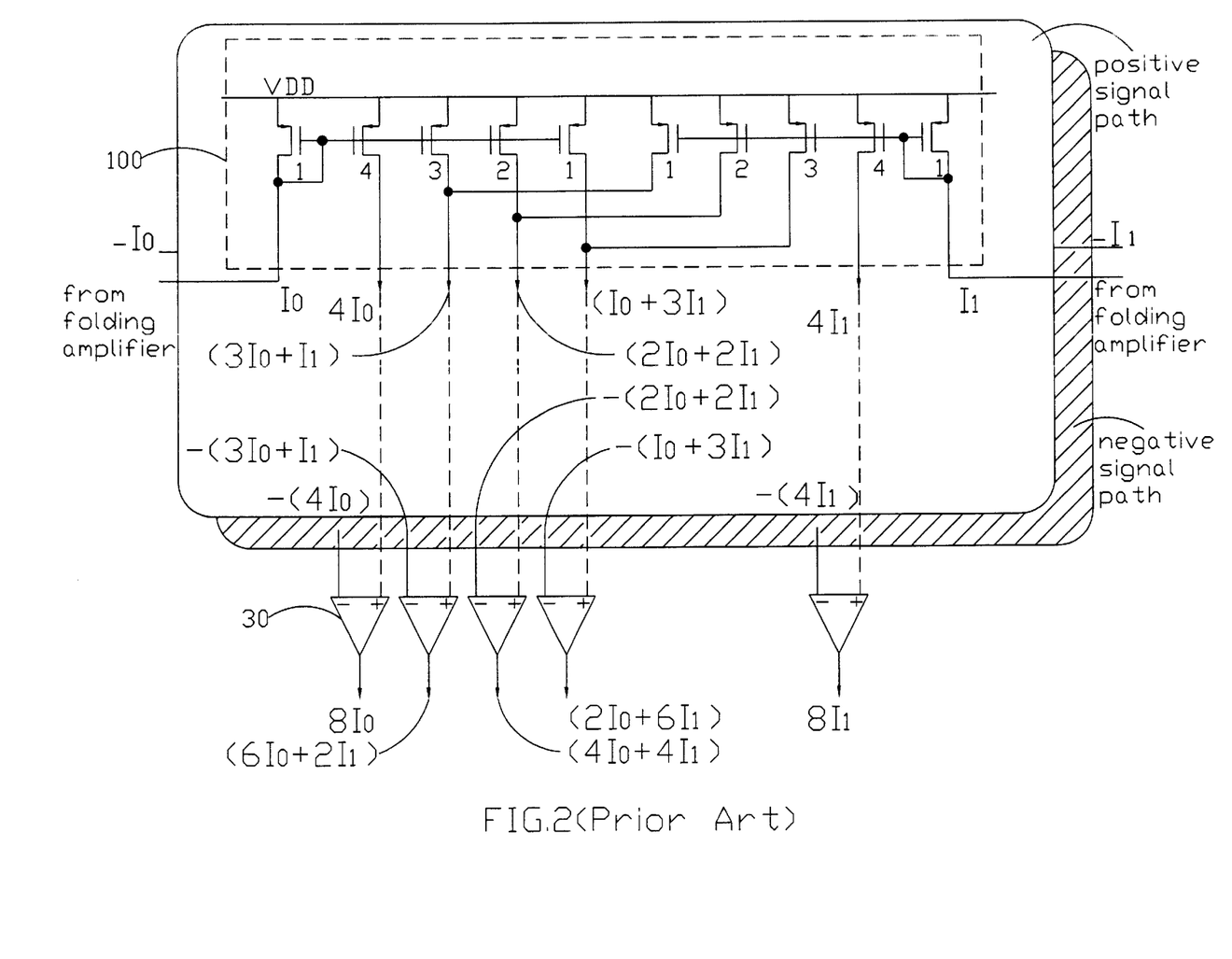
FIG. 2 shows a conventional interpolation circuit.
Figure 3:
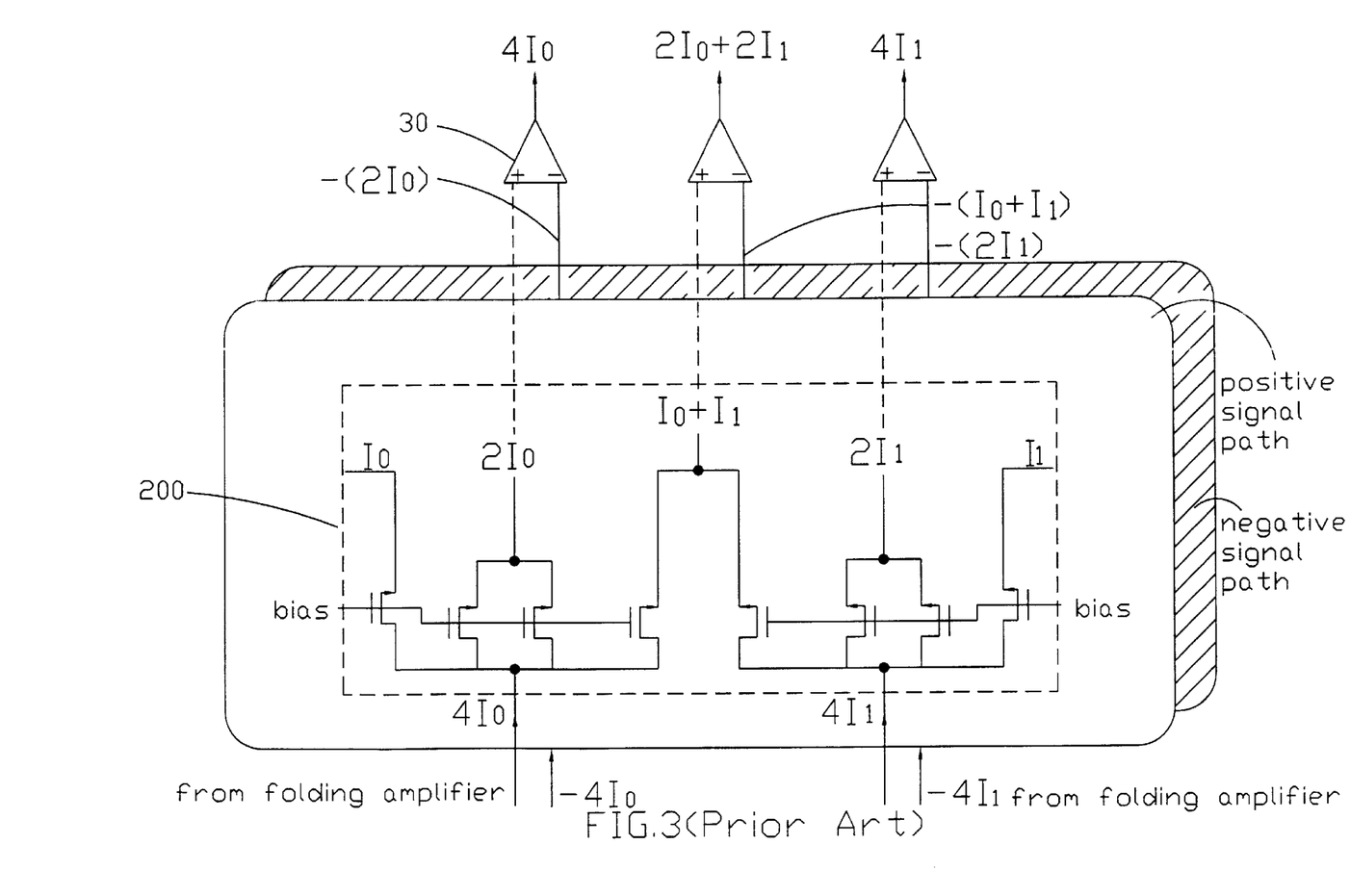
FIG. 3 shows another conventional interpolation circuit.

Current output from the folding amplifier is recently applied in several papers, for instance, IEEE JSSC, Jul. 1996, pp. 938–944 and IEEE JSSC, Sep. 1996, pp. 1248–1257, as shown in FIG. 2 and FIG. 3. Unfortunately, the conventional interpolation circuits mentioned above require a great number of transistors to its implementation, which blocks the improvement for the modern integrated circuits. For the foregoing introduction, there is a need for an interpolation circuit used in an analog-to-digital (A/D) converter to substantially reduce transistor count and its power consumption.

SUMMARY OF THE INVENTION

The primary object of the present invention is to reduce the number of transistors needed in the current mode interpolation circuit, and, by the way, the bandwidth and the area of the current interpolation circuit are thus improved under available power.

In accordance with the present invention, the current interpolation circuit for use in an A/D converter includes two groups of current division circuits or current mirror circuits. One group of the current division circuits (or the current mirror circuits) generates some positive currents, and the other group of the current division circuits (or the current mirror circuits) generates some negative currents. One of the features of the present invention is the configuration of the input signals into a number of current comparators. Each current comparator has two input terminals, one terminal being coupled to receive one of the generated positive currents and the other terminal being coupled to receive one of the generated negative currents. The output of each current comparator is the differential current between these terminals, wherein the magnitude of the input positive current may not be the same as the magnitude of the input negative current. Then the differential current is converted to a voltage. The number of aforementioned positive currents is the same as the number of the negative currents, and the absolute value of each positive current is correspondingly the same as the absolute value of each negative current.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
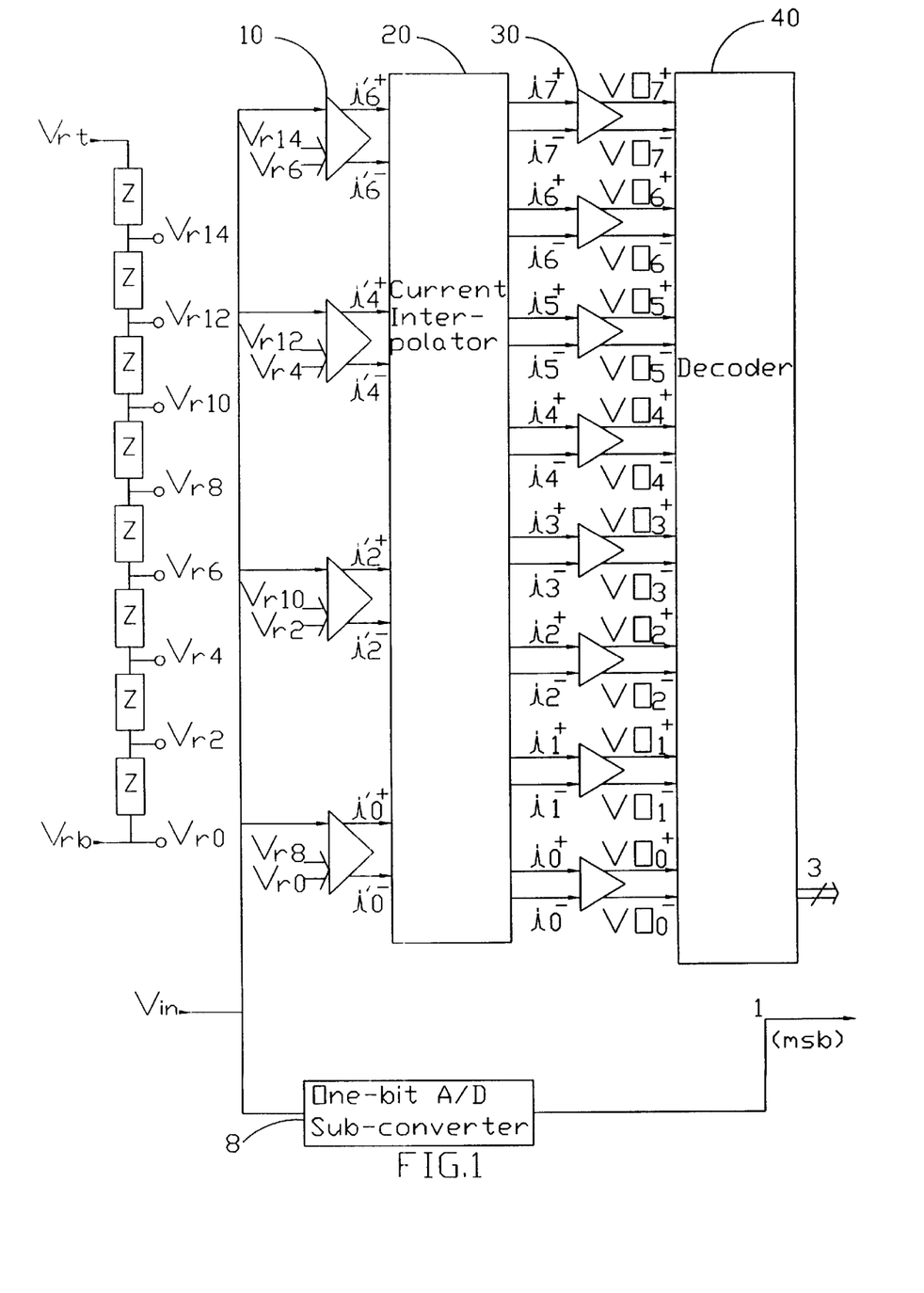
FIG. 1 shows a schematic structure of a 4-bits folding type analog-to-digital (A/D) converter.

FIG. 1 shows a schematic structure of a 4-bits folding type analog-to-digital (A/D) converter which includes an one-bit A/D sub-converter 8, some folding amplifiers 10, a current interpolator 20, several current comparators 30 and a decoder 40. FIG. 2 shows a conventional interpolation circuit. In the figure, $I_0$ and $I_1$ represent positive currents from the positive signal path of the folding amplifiers 10 (FIG. 1), and $-I_0$ and $-I_1$ represent negative currents from the negative signal path of the folding amplifiers 10. According to the current mirror circuit 100 (as shown in the upper part of the figure), the output signals of the current mirror circuit 100 include generated positive currents $4I_0$, $3I_0+I_1$, $2I_0+2I_1$, $I_0+3I_1$, and $4I_1$, and generated negative currents $-4I_0$, $-(3I_0+I_1)$, $-(2I_0+2I_1)$, $-(I_0+3I_1)$, and $-4I^1$. Generally, the generated currents have a quantity greater than the input currents. Further, the generated currents are coupled to some current comparators 30, each of the comparators 30 having two input terminals configured to receive a generated positive current and a generated negative current, respectively. It is noted that the input generated positive current and the generated negative current generally have the same magnitude (or the absolute value). The differential currents of the current comparators 30 are $8I_0$, $6I_0+2I_1$, $4I_0+4I_1$, $2I_0+6I_1$, and $8I_1$, which correspond to interpolated reference voltages $V_{r0}$, $(3V_{r0}+V_{r1})/4$, $(2V_{r0}+2V_{r1})/4$, $(V_{r0}+3V_{r1})/4$, and $V_{r1}$, respectively. Subsequently, the differential current between each pair of the terminals is then converted to a voltage signal. Although a positive signal path containing the positive current mirror is shown in the figure, it is appreciated that there is also a negative signal path (not distinctly shown) containing a negative current mirror, which has a configuration the same as its positive counterpart. More specifically, in the figure, each transistor of the current mirror circuit 100 has an associated legend numeral that indicates its corresponding output current. For example, a transistor with associated legend 4 represents a transistor having a gate width of four unit and being capable of outputting current $4I_0$, while a transistor with associated legend 1 represents a transistor having a gate width of one unit and being capable of outputting current $I_0$. FIG. 3 shows another conventional interpolation circuit, which has a configuration the same as that in FIG. 2 except that a current divider structure 200 is used instead of a current mirror circuit 100.

Figure 4:
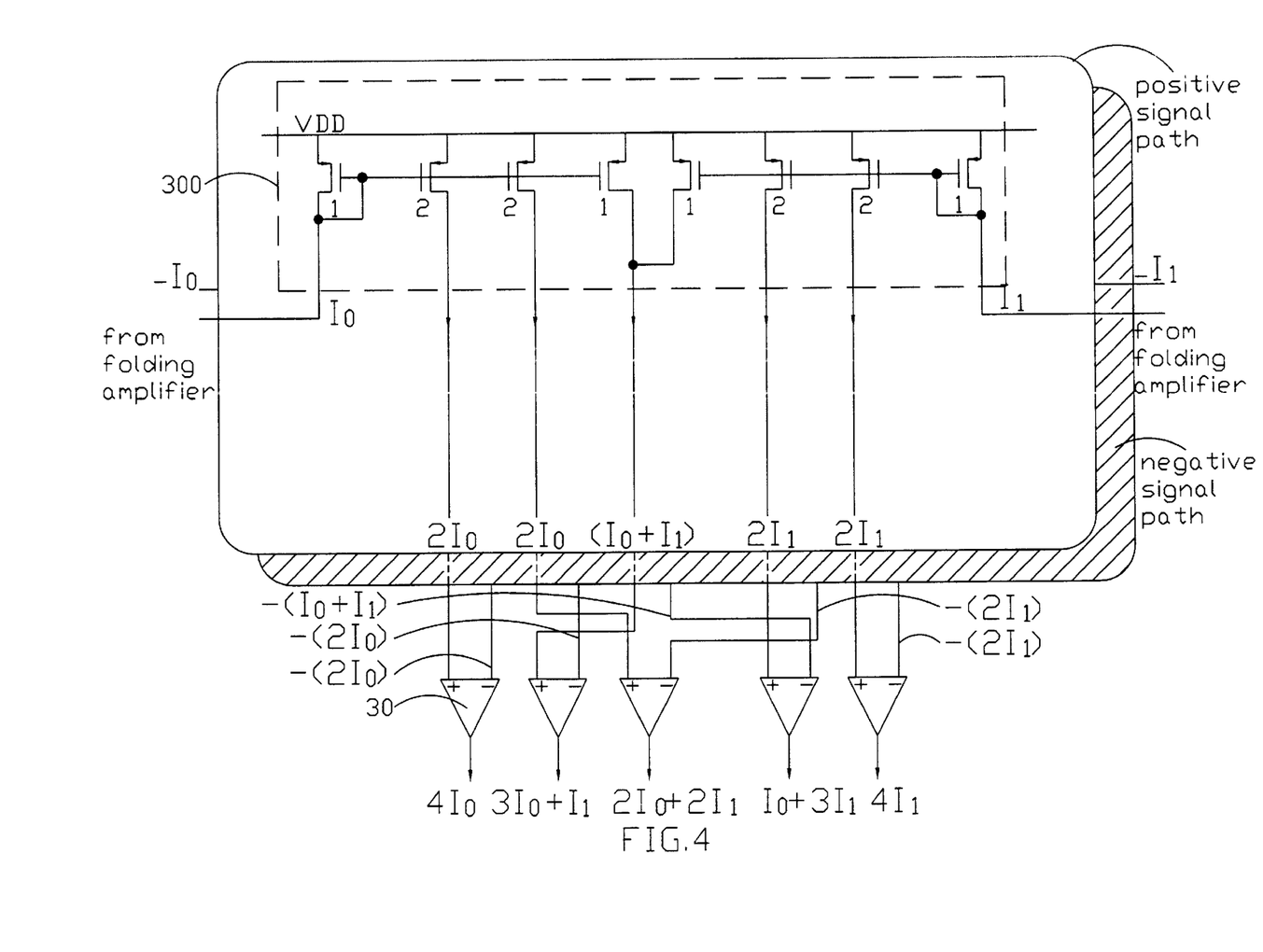
FIG. 4 shows a schematic diagram of an interpolation circuit according to one embodiment of the present invention.

FIG. 4 shows a schematic diagram of an interpolation circuit according to one embodiment of the present invention. In this embodiment, $I_0$ and $I_1$ represent positive currents from the positive signal path of the folding amplifiers 10 (FIG. 1), and $-I_0$ and $-I_1$ represent negative currents from the negative signal path of the folding amplifiers 10. According to the current mirror circuit 300 (as shown in the upper part of the figure), the output signals of the current mirror circuit 300 include generated positive currents $2I_0$, $2I_0$, $I_0+I_1$, $2I_1$, and $2I_1$, and generated negative currents $-2I_0$, $-2I_0$, $-(I_0+I_1)$, $-2I_1$, and $-2I_1$. Generally, the generated currents have a quantity greater than the input currents. Further, the generated currents are coupled to some current comparators 30, each of the comparators 30 having two input terminals configured to receive a generated positive current and a generated negative current, respectively. It is noted that the input generated positive current may have a magnitude (or the absolute value) different from that of the generated negative current. The differential currents of the current comparators 30 are $4I_0$, $3I_0+I_1$, $2I_0+2I_1$, $1I_0+3I_1$, and $4I_1$, which correspond to interpolated reference voltages $V_{r0}$, $(3V_{r0}+V_{r1})/4$, $(2V_{r0}+2V_{r1})/4$, $(V_{r0}+3V_{r1})/4$, and $V_{r1}$, respectively. Subsequently, the differential current between each pair of the terminals is then converted to a voltage signal. Although a positive signal path containing the positive current mirror is shown in the figure, it is appreciated that there is also a negative signal path (not distinctly shown) containing a negative current mirror, which has a configuration the same as its positive counterpart. Compared to the conventional interpolation circuit in FIG. 2 (both having five interpolated reference levels), the interpolation circuit in FIG. 4 of the present embodiment uses 5 (i.e., 1+2+2) unit transistors, while the conventional circuit requires 10 (i.e., 1+2+3+4) unit transistors.

Figure 5:
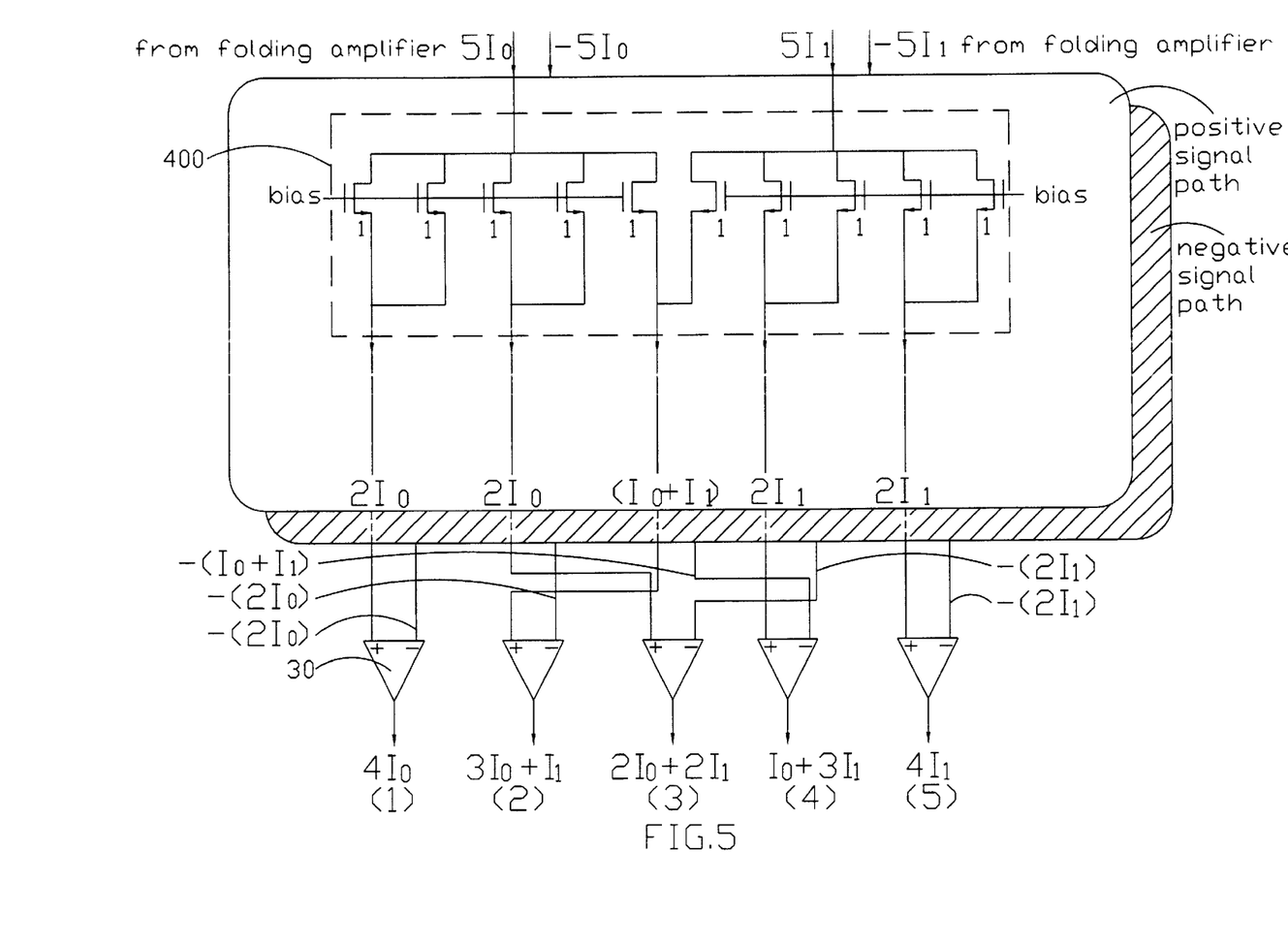
FIG. 5 shows a schematic diagram of an interpolation circuit according to another embodiment of the present invention.

FIG. 5 shows a schematic diagram of an interpolation circuit according to another embodiment of the present invention, which has a configuration the same as that in FIG. 4 except that a current divider structure 400 is used instead of a current mirror circuit 300. Further, both configurations use the same number of unit transistors. Moreover, both circuits have the same number of generated positive currents and generated negative currents, and each current in both circuits has the same corresponding magnitude.

Figure 6:
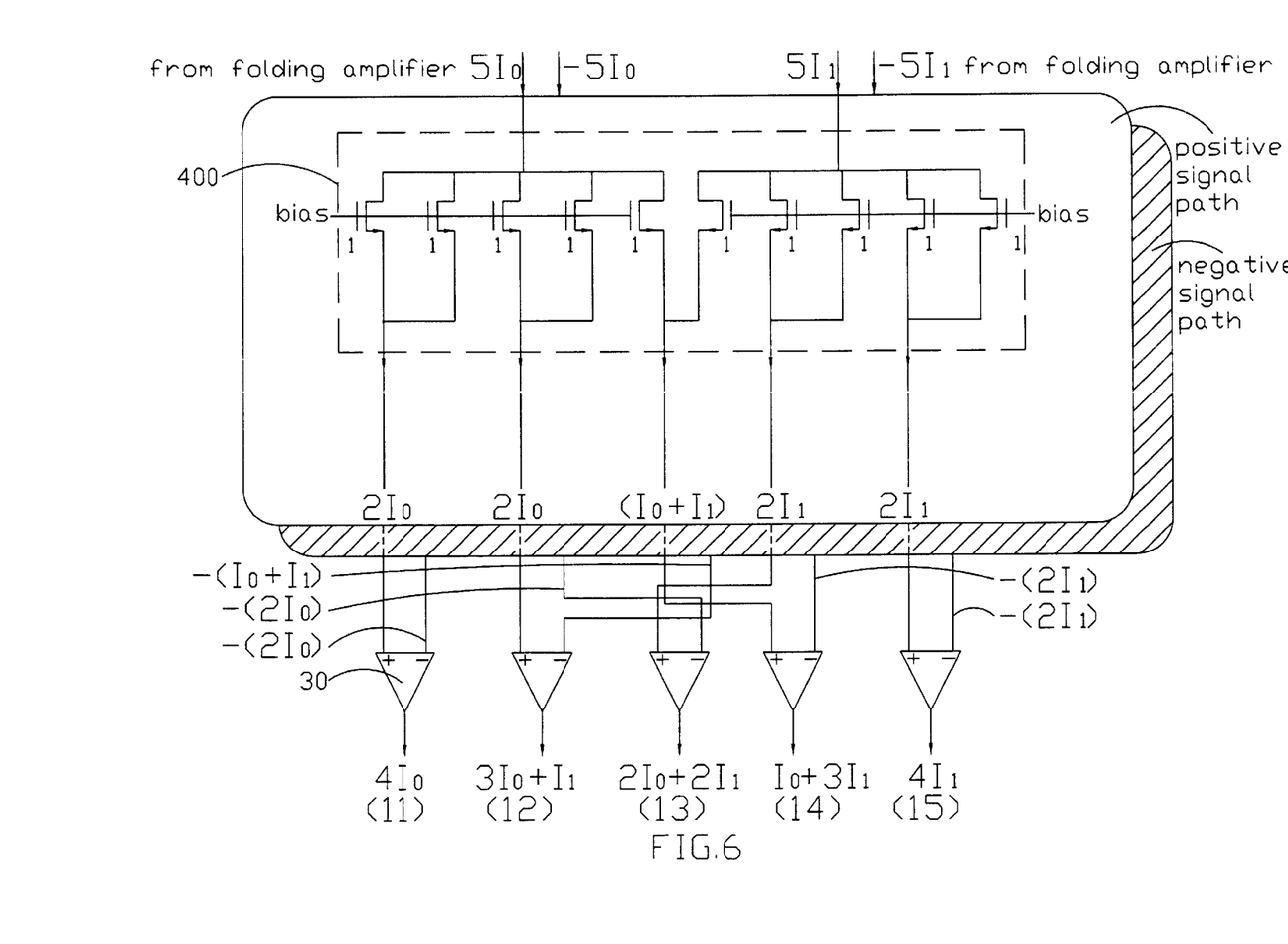
FIG. 6 shows a schematic diagram of an interpolation circuit according to a further embodiment of the present invention.

FIG. 6 shows a schematic diagram of an interpolation circuit according to a further embodiment of the present invention. The circuit of this figure is the same as that in FIG. 5 except having a different routing of the generated current from the divider circuit 400 to the current comparators 30. Nevertheless, both circuits have the same interpolated levels.

Figure 7:
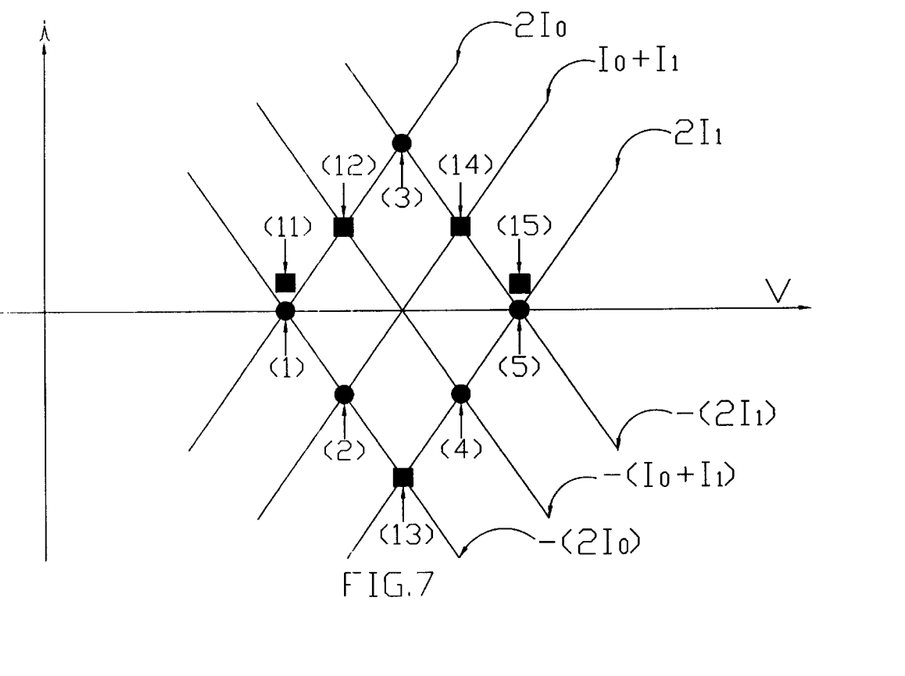
FIG. 7 shows a diagram demonstrating the crossing points detected by the current comparators in FIG. 5 and FIG. 6.
Figure 8:
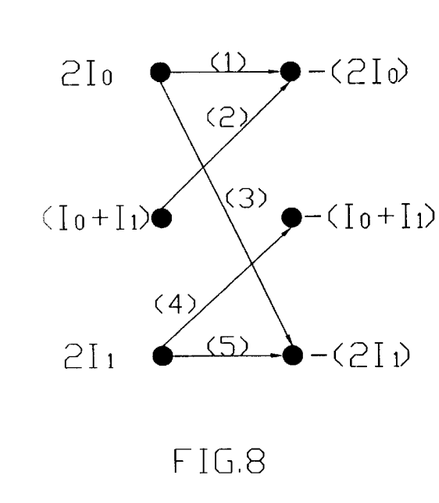
FIG. 8 illustrates the configuration between the generated currents and the input terminals of the current comparators in FIG. 5.
Figure 9:
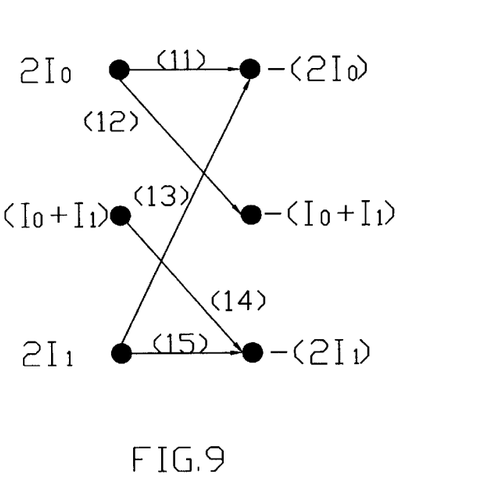
FIG. 9 illustrates the configuration between the generated currents and the input terminals of the current comparators in FIG. 6.

FIG. 7 shows a diagram demonstrating the crossing points detected by the current comparators 30 in FIG. 5 and FIG. 6, wherein the X-axis represents the corresponding reference voltage. Specifically, the solid dots represent the crossing points detected by the current comparators 30 in FIG. 5, while the configuration between the generated currents and the input terminals of the current comparators is further illustrated in FIG. 8. The solid squares in FIG. 7 represent the crossing points detected by the current comparators 30 in FIG. 6, while the configuration between the generated currents and the input terminals of the current comparators is further illustrated in FIG. 9. Referring to FIG. 8 and FIG. 9, two solid dots paired by an arrow represent the specific positive current and the negative current that are simultaneously inputted to a current comparator. Further, the bracketed numeral along each arrow indicates the attained interpolated level having the same bracketed numerals in FIG. 5 and FIG. 6.

Figure 10:
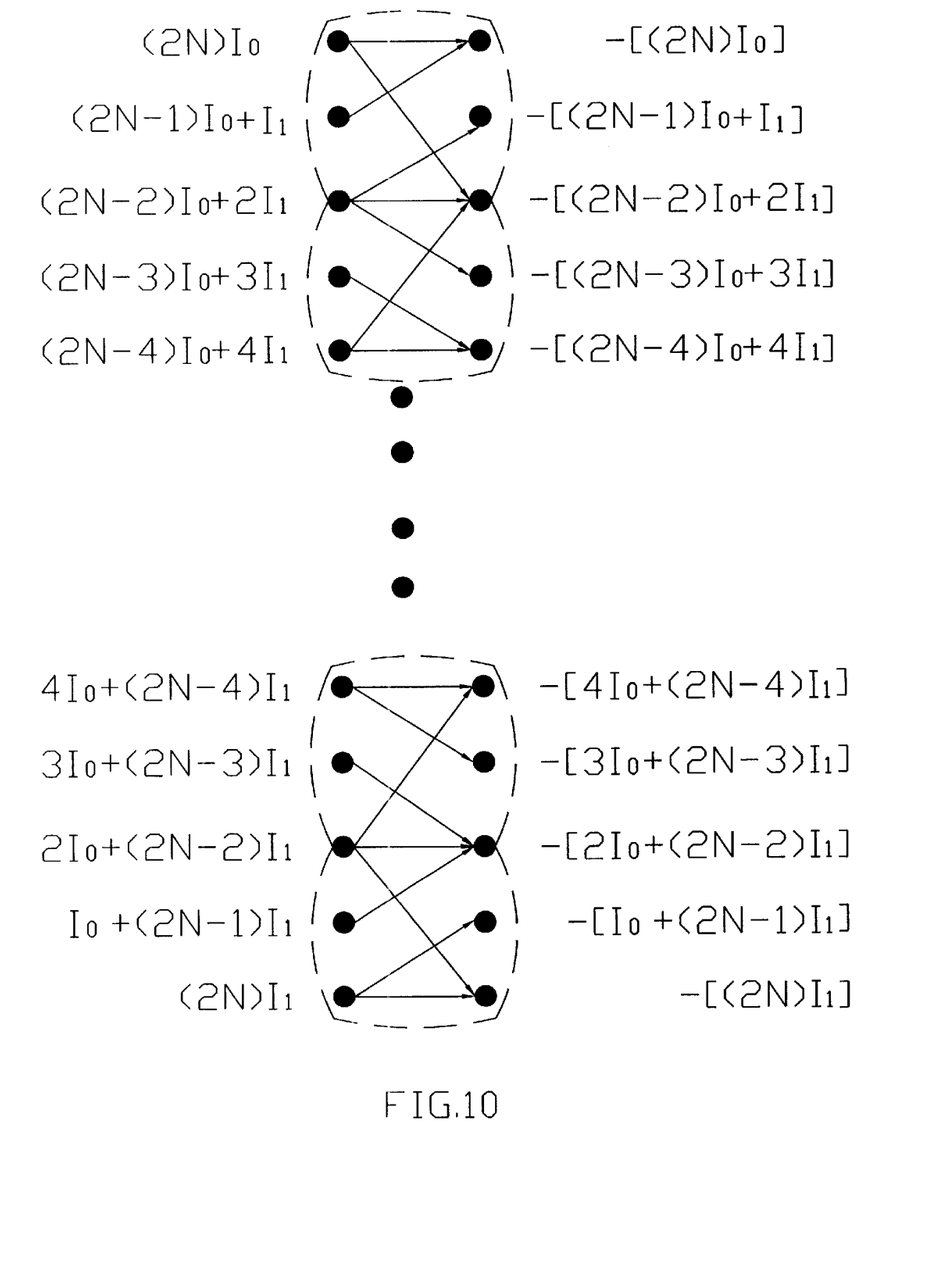
FIG. 10 illustrates the configuration between the generated currents and the input terminals of the current comparators for a general embodiment according to the present invention.

FIG. 10 illustrates the configuration between the generated currents and the input terminals of the current comparators for a general embodiment according to the present invention. In this general embodiment, there are 4N+1 of interpolated levels. Generally, there are N of dotted frames, 4N+1 arrows, 4N+1 generated positive currents from the current mirror or the current divider, and 4N+1 generated negative currents from the current mirror or the current divider. More specifically, the generated positive current signals include two $(2N)I_0$, totally of N of $[(2N-1)I_0+I_1$, $(2N-3)I_0+3I_1$, $(2N-5)I_0+5I_1$, ..., $5I_0+(2N-5)I_1$, $3I_0+(2N-3)I_1$, and $I_0+(2N-1)I_1]$, totally of 3(N-1) of [three $(2N-2)I_0+2I_1$, three $(2N-4)I_0+4I_1$, three $(2N-6)I_0+6_1$, ..., three $6I_0+(2N-6)I_1$, three $4I_0+(2N-4)I_1$, three $2I_0+(2N-2)I_1]$, and two $(2N)I_1$, wherein N is an integer. Similarly, the generated negative current signals comprise two $-(2N)I_0$, totally of N of $\{-[(2N-1)I_0+I_1], -[(2N-3)I_0+3I_1], -[(2N-5)I_0+5I_1], ..., -[5I_0+(2N-5)I_1], -[3I_0+(2N-3)I_1],$ and $-[I_0+(2N-1)I_1]\}$, totally of 3(N-1) of {three $-[(2N-2)I_0+2I_1]$, three $-[(2N-4)I_0+4)I_1]$, three $-[(2N-6)I_0+6)I_1]$, ..., three $-[6I_0+(2N-6)I_1]$, three $-[4I_0+(2N-4)I_1]$, three $-[2I_0+(2N-2)I_1]$, and two $-(2N)I_1$. Accordingly, the differential currents of the current comparators are $(4N)I_0$, $(4N-1)I_0+I_1$, $(4N-2)I_0+2I_1$, $(4N-3)I_0+3I_1$, ..., $3I_0+(4N-3)I_1$, $2I_0+(4N-2)I_1$, $I_0+(4N-1)I_1$, and $(4N)I_1$, which have a total of 4N+1. These differential currents thus correspond to interpolated levels $V_{r0}$, $[(4N-1)V_{r0}+V_{r1}]/(4N)$, $[(4N-2)V_{r0}+2V_{r1}]/(4N)$, ..., $[2V_{r0}+(4N-2)V_{r1}]/(4N)$, $[V_{r0}+(4N-1)V_{r1}]/(4N)$, and $V_{r1}$, respectively. Conclusively, the present invention can substantially reduce the unit transistors required (generally $(1+2+3+ ... +4N)=8N^2+2N$) compared to $4N^2+N$ (i.e., $\{4N+[1+3+5+ ... +(2N-1)]+3[2+4+6+ ... +(2N-2)]\}$) utilized in a conventional interpolation circuit.

Although specific embodiments have been illustrated and described, it will be obvious to those skilled in the art that various modifications may be made without departing from what is intended to be limited solely by the appended claims.

What is claimed is:

1. An interpolation circuit for use in an analog-to-digital converter (ADC), said interpolation circuit comprising:

a plurality of folding amplifiers for converting a plurality of reference input voltages into a plurality of positive current signals and a plurality of negative current signals;

two current dividers, one of said current dividers being configured to receive said plurality of positive current signals for generating a plurality of generated positive current signals having a quantity larger than said positive current signals, the other of said current dividers being configured to receive said plurality of negative current signals for generating a plurality of generated negative current signals having a quantity larger than said negative current signals; and a plurality of current comparators, each of said current comparators having a first input terminal coupled to receive one of said generated positive current signals, and having a second input terminal coupled to receive one of said generated negative current signals, wherein differential current between the first input terminal and the second input terminal of each current comparator is then transformed into a differential voltage signal which is used as one of interpolated levels.

2. The interpolation circuit according to claim 1, wherein quantity of said plurality of the positive current signals and quantity of said plurality of the negative current signals are the same, and magnitude of said positive current signals and magnitude of said negative current signals are correspondingly the same.

3. The interpolation circuit according to claim 1, wherein quantity of said plurality of the generated positive current signals and quantity of said plurality of the generated negative current signals are the same, and magnitude of said generated positive current signals and magnitude of said generated negative current signals are correspondingly the same.

4. The interpolation circuit according to claim 1, wherein said plurality of the folding amplifiers output at least two signals $I_0$ and $I_1$ with positive potential, and at least two signal $-I_0$ and $-I_1$ with negative potential.

5. The interpolation circuit according to claim 4, wherein said generated positive current signals comprise two $(2N)I_0$, totally of N of $[(2N-1)I_0+I_1, (2N-3)I_0+3I_1, (2N-5)I_0+5I_1, \ldots, 5I_0+(2N-5)I_1, 3I_0+(2N-3)I_1,$ and $I_0+(2N-1)I_1]$, totally of $3(N-1)$ of [three $(2N-2)I_0+2I_1$, three $(2N-4)I_0+4I_1$, three $(2N-6)I_0+6I_1, \ldots,$ three $6I_0+(2N-6)I_1$, three $4I_0+(2N-4)I_1$, three $2I_0+(2N-2)I_1]$, and two $(2N)I_1$, and wherein said generated negative current signals comprise two $-(2N)I_0$, totally of N of $\{-[(2N-1)I_0+I_1], -[(2N-3)I_0+3I_1], -[(2N-5)I_0+5I_1], \ldots, -[5I_0+(2N-5)I_1], -[3]I_0+(2N-3)I_1],$ and $-[I_0+(2-N1)I_1]\}$, totally of $3(N-1)$ of $\{$three $-[(2N-2)I_0+2I_1]$, three $-[(2N-4)I_0+4I_1]$, three $-[(2N-6)I_0+6I_1], \ldots,$ three $-[6I_0+(2N-6)_1]$, three $-[4I_1+(2N-4)I_1]$, three $-[2I_0+(2N-2)I_1]]$, and two $-(2N)I_1$, wherein N is an integer.

6. The interpolation circuit according to claim 5, wherein said differential currents comprise $(4N)I_0$, $(4N-1)I_0+I_1$, $(4N-2)I_0+2I_1$, $(4N3)I_0+3I_1, \ldots, 3I_0+(4N-3)I_1, 2I_0+(4N-2)I_1, I_0+(4N-1)I_1,$ and $(4N)I_1$, which have a total of $4N+1$, said differential currents correspond to $V_{r0}$, $[(4N-1)V_{r0}+V_{r1}]/(4N)$, $[(4N-2)V_{r0}+2V_{r1}]/(4N), \ldots, [2V_{r0}+(4N-2)V_{r1}]/(4N)$, $[V_{r0}+(4N-1)V_{r1}]/(4N)$, and $V_{r1}$, respectively.

7. An interpolation circuit for use in an analog-to-digital converter (ADC), said interpolation circuit comprising:

a plurality of folding amplifiers for converting a plurality of reference input voltages into a plurality of positive current signals and a plurality of negative current signals;

two current mirrors, one of said current mirrors being configured to receive said plurality of positive current signals for generating a plurality of generated positive current signals having a quantity larger than said positive current signals, the other of said current mirrors being configured to receive said plurality of negative current signals for generating a plurality of generated negative current signals having a quantity larger than said negative current signals; and a plurality of current comparators, each of said current comparators having a first input terminal coupled to receive one of said generated positive current signals, and having a second input terminal coupled to receive one of said generated negative current signals, wherein differential current between the first input terminal and the second input terminal of each current comparator is then transformed into a differential voltage signal which is used as one of interpolated levels.

8. The interpolation circuit according to claim 7, wherein quantity of said plurality of the positive current signals and quantity of said plurality of the negative current signals are the same, and magnitude of said positive current signals and magnitude of said negative current signals are correspondingly the same.

9. The interpolation circuit according to claim 7, wherein quantity of said plurality of the generated positive current signals and quantity of said plurality of the generated negative current signals are the same, and magnitude of said generated positive current signals and magnitude of said generated negative current signals are correspondingly the same.

10. The interpolation circuit according to claim 7, wherein said plurality of the folding amplifiers output at least two signals $I_0$ and $I_1$ with positive potential, and at least two signal $-I_0$ and $-I_1$ with negative potential.

11. The interpolation circuit according to claim 10, wherein said generated positive current signals comprise two $(2N)I_0$, totally of N of $[(2N-1)I_0+I_1, (2N-3)I_0+3I_1, (2N-5)I_0+5I_1, \ldots, 5I_0+(2N-5)I_1, 3I_0+(2N-3)I_1,$ and $I_0+(2N-1)I_1]$, totally of $3(N-1)$ of [three $(2N-2)I_0+2I_1$, three $(2N-4)I_0+4I_1$, three $(2N-6)I_0+6I_1, \ldots,$ three $2I_0+(2N-2)I_1]$, and two $(2N)I_1$, and wherein said generated negative current signals comprise two $-(2N)I_0$, totally of N of $\{-[(2N-1)I_0+I_1], -[(2N3)I_0+3I_1], -[(2N-5)I_0+5I_1], \ldots, -[5I_0+(2N-5)I_1], -[3I_0+(2N-3)I_1],$ and $-[I_0+(2N1)-1)I_1]\}$, totally of $3(N-1)$ of $\{$three $-[(2N-2)I_0+2I_1]$, three $-[(2N-4)I_0+4I_1]$, three $-[(2N-6)I_0+6I_1], \ldots,$ three $-[6I_0+(2N-6)I_1]$, three $-[4I_0+(2N-4)I_1]$, three $-[2I_0+(2N-2)I_1]$, and two $-(2N)I_1$, wherein N is an integer.

12. The interpolation circuit according to claim 11, wherein said differential currents comprise $(4N)I_0$, $(4N-1)I_0+I_1$, $(4N-2)I_0+2I_1$, $(4N-3)I_0+3I_1, \ldots, 3I_0+(4N-3)I_1, 2I_0+(4N-2)I_1, I_0+(4N-1)I_1,$ and $(4N)I_1$, which have a total of $4N+1$, said differential currents correspond to $V_{r0}$, $[(4N-1)V_{r0}+V_{r1}](4N)$, $[(4N-2)Vr_0+2V_{r1}]/(4N), \ldots, [2V_{r0}+(4N-2)V_{r1}](4N)$, $[V_{r0}+(4N-1)V_{r1}]/(4N)$, and $V_{r1}$, respectively.

\* \* \* \* \*